United States Patent [19]

Fong et al.

[11] 4,140,591
[45] Feb. 20, 1979

[54] PHOTOELECTROLYTIC APPARATUS FOR WATER SPLITTING

[75] Inventors: Francis K. Fong, West Lafayette, Ind.; Lory Galloway, Wilmington, Del.

[73] Assignee: Purdue Research Foundation, West Lafayette, Ind.

[21] Appl. No.: 866,434

[22] Filed: Jan. 3, 1978

[51] Int. Cl.$^2$ .......................... C25D 5/00; C25B 1/02
[52] U.S. Cl. ..................... 204/38 R; 204/40; 204/129; 204/278; 204/DIG. 3; 136/89 NB; 357/8; 429/111
[58] Field of Search ............... 204/38 R, 40, 129, 278, 204/DIG. 3; 136/89 NB; 429/111; 357/8

[56] References Cited

U.S. PATENT DOCUMENTS 4,022,950  5/1977  Fong et al. ........................ 429/105

OTHER PUBLICATIONS

P. H. Fang, "Analysis of Conversion Efficiency of Organic-Semi-Conductor Solar Cells", *J. Appl. Phys.*, vol. 45, pp. 4672–4673 (1974).

F. K. Fong et al., "Far Red Photogalvanic Splitting of Water by Chlorophyll a Dihydrate. A New Model of Plant Photosynthesis", *J. Am. Chem. Soc.*, vol. 99, pp. 5802–5804 (1977).

Anonymous, "Research Clears Up Some of the Puzzles of Photosynthesis", *Chem. and Eng. News*, pp. 23–24, May 3, 1976.

F. K. Fong et al., "In Vitro Solar Conversion after the Primary Light Reaction in Photosynthesis Reversible Photogalvanic Effects of Chlorophyll–Quinhydron Half-Cell Reactions", *J. Am. Chem. Soc.*, vol. 98, pp. 2287–2289 (1976).

Anonymous, "'Synthetic Leaf' Mimics Plants' Light Conversion", *Chem. and Eng. News*, pp. 32–34, Feb. 16, 1976.

Y. Toyoshima et al., "Photo-oxidation of Water in Phospholipid Bilayer Membranes Containing Chlorophyll a", *Nature*, vol. 265, pp. 187–189 (1977).

*Primary Examiner*—Aaron Weisstuch
*Attorney, Agent, or Firm*—John R. Nesbitt

[57] ABSTRACT

Platinized chlorophyll a dihydrate polycrystals are used to expedite the photochemical cleavage of water to yield molecular hydrogen and oxygen. The peak quantum efficiency of this photoelectrolytic apparatus at 740 nm is about 20%.

3 Claims, 6 Drawing Figures

PHOTOELECTROLYTIC APPARATUS FOR WATER SPLITTING

FIELD OF THE INVENTION

This invention relates to photoelectrolytic cells, and more particularly to such a cell capable of enhancing the yield of $H_2$ from such a cell.

BACKGROUND OF THE INVENTION

Recently, in Fong, et al, U.S. Pat. No. 4,022,950, the observation of Chl a photogalvanic water splitting reactions that result from irradiation of the chlorphyll a dihydrate aggregate $(Chl\ a\cdot 2H_2O)_n$ in the far red wavelength region was disclosed. However, the quantum efficiency of the observed effects was low, and we were unable to detect the discharge of $H_2$ by direct analytical means. The photoelectrolysis of water is a direct process for harvesting solar energy to produce gaseous hydrogen for fuel. Considerable attention has been focused on n-type semiconducting photoanodes such as $TiO_2$ and $SrTiO_3$. However, these materials operate in the near ultraviolet wavelength region where the solar radiant energy density is low.

In our earlier photochemical conversion experiments, as reported in J. Amer. Chem. Soc., Vol 99, p. 5802 (1977), the chlorophyll a was plated on a shiny Pt electrode. The photolytic reactions were detected by measuring the flow of electrons in an external circuit of a photogalvanic assembly consisting of a Pt-Chl suspended electrode suspended in an aqueous electrolyte in a half cell and a Chl a-free electrode suspended in another half cell. That apparatus, while novel, provided only a low quantum efficiency.

DESCRIPTION OF THE INVENTION

It occurred to us that the low quantum efficiency of the photoelectrolytic cell described in U.S. Pat. No. 4,022,950 may have resulted from the poor contact between the smooth metal surface of the platinum electrode and the chlorophyll a plated thereon. We accordingly sought to overcome the problem of low quantum efficiency by filling in the crevices that separate the polycrystalline Chl a aggregates from each other and from the smooth metal electrode surface by the addition of finely divided Pt particles. After the addition of the Pt particles in the manner described in detail hereafter, we were successful in accomplishing profuse gaseous $H_2$ evolution due to water splitting.

THE DRAWINGS

DETAILED DESCRIPTION OF THE INVENTION

Figure 5:
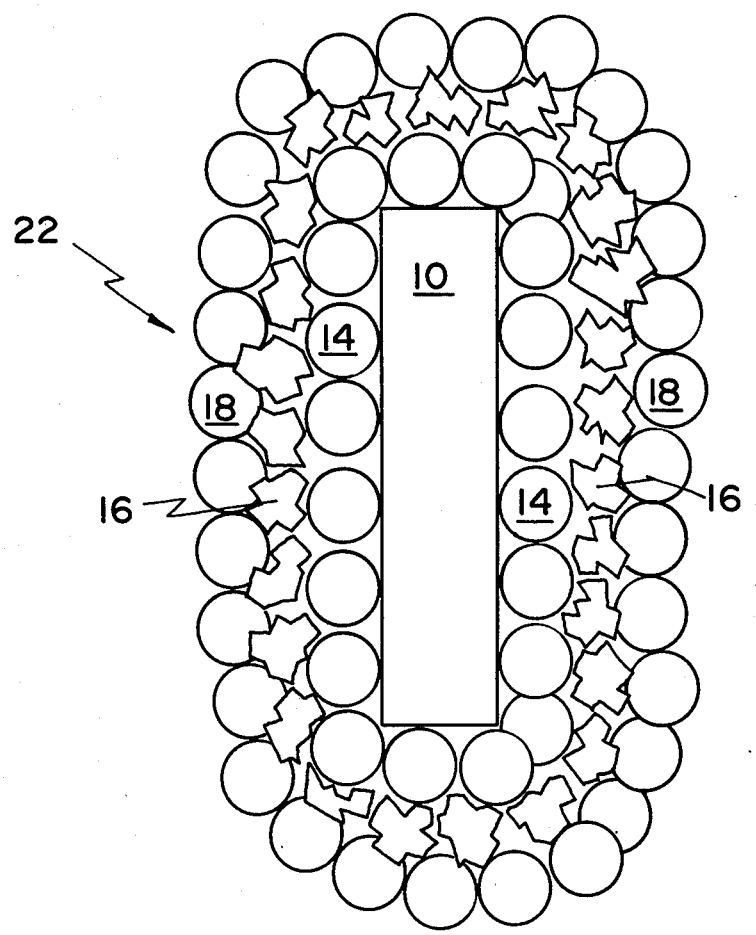
FIG. 5 is a magnified (not to scale) cross sectional view of the electrode of the present invention taken on line A—A of FIG. 4.

A shiny Pt foil 10 was platinized by passing a 30 mAmp current for 10 min through a $7 \times 10^{-2}M$ chloroplatinic acid solution 12 containing $6 \times 10^{-4}M$ Pb acetate, thus leaving a first layer of Pt-black 14 on said foil. A layer of polycrystalline chlorophyll 16*, containing $1.5 \times 10^{17}$ Chl a molecules, was deposited on the platinized electrode surface using the procedure described by Tang and Albrecht, Mol. Cryst. Lig. Cryst., Vol 25, p. 53 (1974). The Chl a plated electrode was then platinized again in the same chloroplatinic acid solution, leaving a second layer of Pt-black 18* on the chlorophyll layer 16*, forming a sandwich structure as shown in FIG. 5, except that the 30 mAmp current was passed for only 15 sec. The platinized Chl a was then allowed to equilibrate in a warm water bath at 70° C for several hours.

Figure 1:
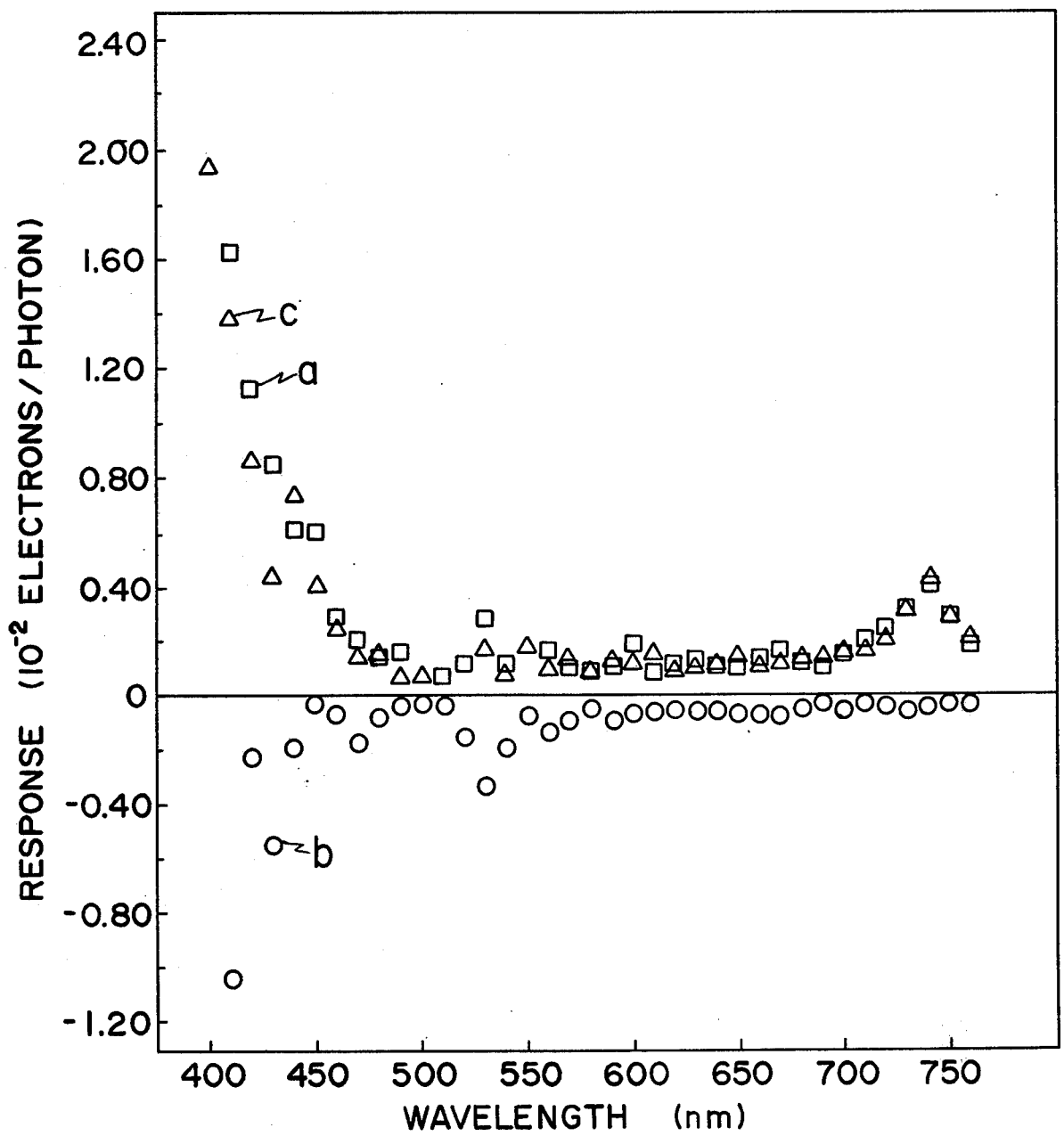
FIG. 1 is a graphic representation of photoelectrolytic cell response wherein the "a" points indicate the response of the cell under an Ar atmosphere, the "b" points represent the cell response when the electrolyte was saturated with $O_2$, and the "c" points represent cell response upon purging the $O_2$ saturated electrolyte with Ar.
Figure 4:
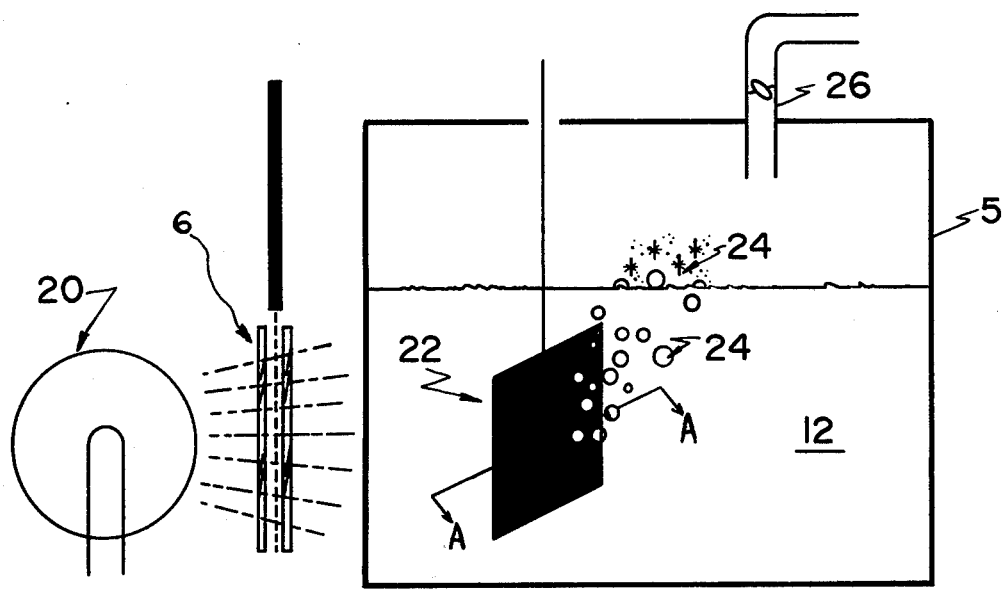
FIG. 4 is a diagram of the photolytic cell of this invention.

The action spectra of the photogalvanic response of the platinized Chl a electrode at pH 7 measured in the manner described previously in U.S. Pat. No. 4,022,950, employing as the second half cell a platinized electrode not covered with Chl a, is shown in FIG. 1. The electrode, prepared as described, was then suspended in a case 5 and immersed in an aqueous electrolyte 12 (FIG. 4). Then the electrode was irradiated with light from source 20 which passes through filter 6. The 740 nm maximum of the spectral response shown in FIG. 1 confirms that $(Chl\ a\cdot 2H_2O)_n$ is primarily responsible for the observed photogalvanic effects. Under an Ar atmosphere shown in FIG. 1a, the observed photogalvanic response of the Chl a cell is positive. A remarkable change was observed when the electrolyte solution was saturated with $O_2$. The photogalvanic current reversed in sign, as shown in FIG. 1b. On purging the $O_2$ saturated solution with Ar, the photogalvanic response in FIG. 1a was restored, and the trace proving such restoration is shown in FIG. 1c.

In order to enhance the photogalvanic response, the pH values of the Chl a and Chl a-free half cells were maintained at 3 and 11, respectively, in a control experiment. After the half cells were degassed by the passage of Ar gas for about 30 min, the photogalvanic response of the cell was monitored with the entire output from a 1000 watt tungsten halogen lamp 20 focused on the platinized Chl a electrode 22. An initial photocurrent of about 1 $\mu$Amp was obtained. After two hours of continuous irradiation, a reversal in sign of the photocurrent was observed, being indicative of a buildup in the $O_2$ content of the electrolyte solution. Continued irradiation of the cell with an open external circuit led to the observation of profuse gas evolution in the form of bubbles 24 from the Pt-Chl a electrode. The formation of gas bubbles in the illuminated area occurred instantaneously upon irradiation of the Pt-Chl a plated electrode prepared as described. In order to eliminate the possibility that the gas bubbles may have resulted from the degassing of Ar due to heating by the light source, the cell was purged with He and the experiment was repeated under a positive pressure of He. The solubility of He in water increases with increasing temperature, being 0.94 and 1.21 ml/100 water at 25 and 75° C, respectively. Profuse gas evolution was again observed under identical illumination conditions. When a Chl a-free platinized Pt electrode was irradiated under these conditions, no signs of bubbling were detected.

Figures 2A, 2B:
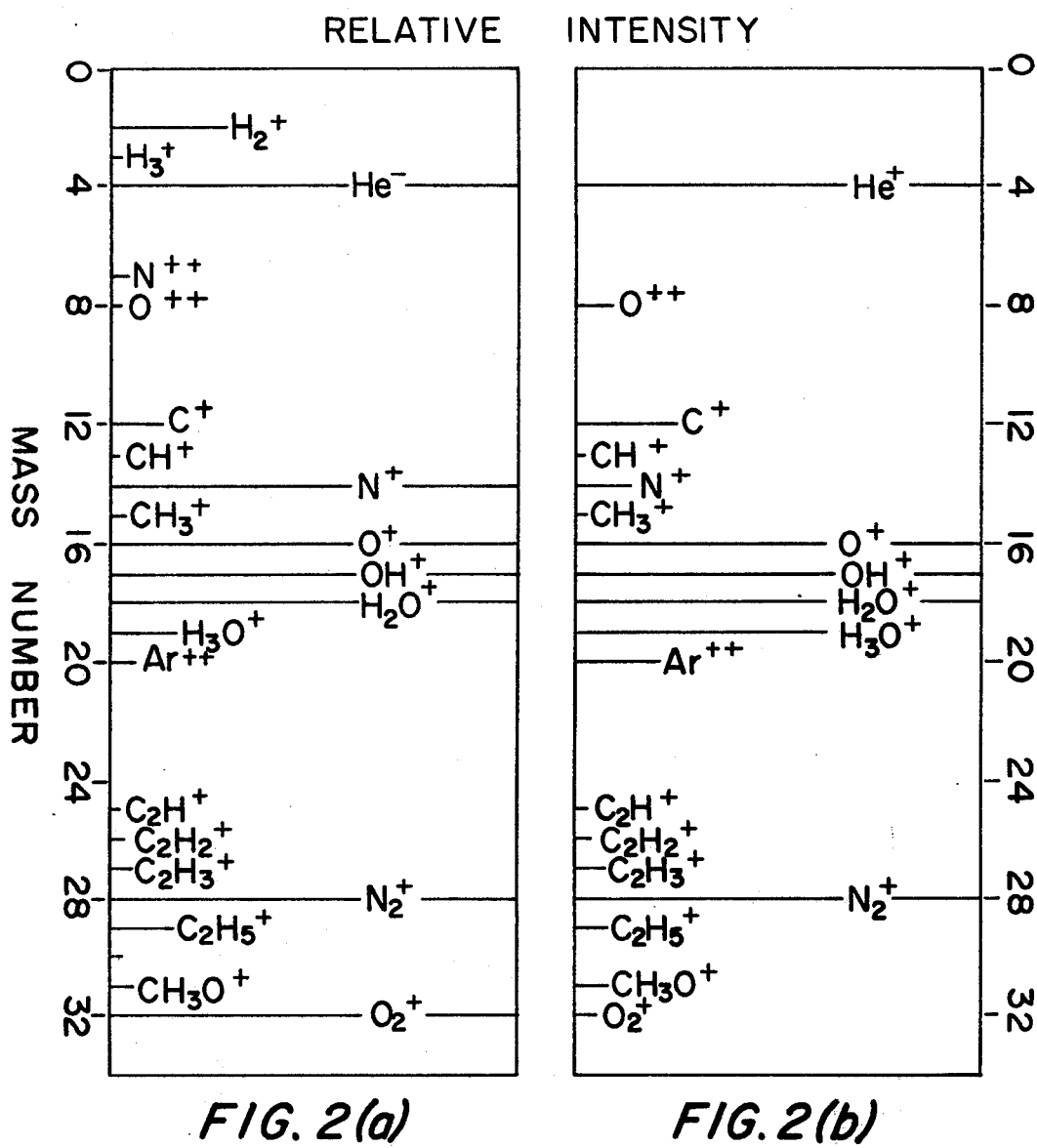
FIG. 2a is a mass spectrum analysis of the gas above the electrolyte by the cell of the present invention after light irratiation.
FIG. 2b is a mass spectrum analysis of the gas above the electrolyte by a cell using a plain platinum electrode after light irradiation.

The gaseous content collected above the electrolyte solution after the platinized Chl a electrode was illuminated for 30 minutes was evacuated through tube 26 directly into the sample chamber of a Consolidated Electrodynamics Corporation 21-110-B mass spectrometer. The resulting mass spectrum is shown in FIG. 2a. In addition to the expected $He^+$ line at mass 4, a strong peak at mass 2 with an attendant trace peak at mass 3 was observed. The latter peaks are respectively attributed to $H_2^+$ and the triatomic ion $H_3^+$. These identifications were confirmed by using pure $H_2$ and He as source. The gaseous content above the electrolyte solution in the Chl a-free cell was also analyzed by mass spectrometry after a similar light treatment of the Chl a-free platinized electrode and the analysis shown in FIG. 2b. No lines at masses 2 and 3 were detected. Small quantities of $H_2^+$ are known to accompany hydrocarbon fragments at masses 13, 15, 25, 26, 27 and 29. These fragments are found to occur in similar intensity ratios in both the sample and blank determinations shown in FIG. 2. The possibility that the observed $H_2^+$ line may have originated from hydrocarbon fragmentation is thus ruled out.

As a verification, the mass spectrum of a 95:5 mixture of n-hexane and ethanol was obtained. The $H_2^+$ line was observed in the hydrocarbon mixture. However, the observed intensity ratios of the $H_2^+$ line to the various hydrocarbon fragments are one to two orders of magnitude smaller than the corresponding ratios in the photoelectrolytic sample. The $O_2^+$ line at 32 is more than an order of magnitude more intense in the sample gas than the corresponding line in the blank. Molecular oxygen is, of course, one of the two principal products in the water splitting reaction.

Figure 3:
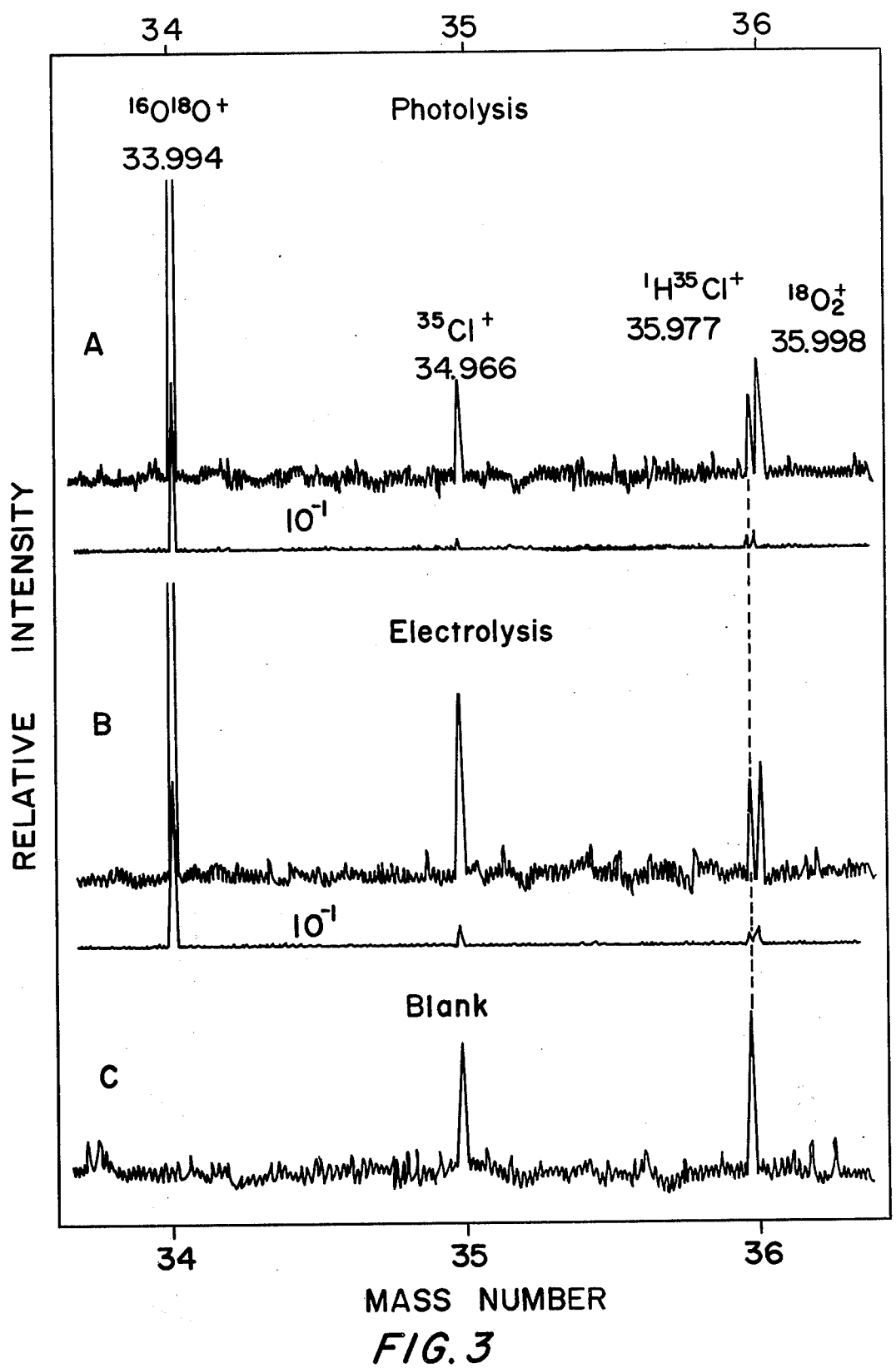
FIGS. 3A and 3B are mass spectrum analyses of the gas above the electrolyte in a cell using the electrode of the present invention, wherein $O_{18}$ was injected into the cell, 3A showing the gas analysis after photolysis, and 3B showing gas analysis of the same cell after electrolysis.
FIG. 3C is a mass spectrum of the gas from a cell having a plain electrode.

As a further verification that $H_2$ is in fact generated by the new cell, a cell using the electrode of the present invention was injected with isotope $O_{18}$ and subjected to both photolysis and electrolysis. The results are shown in FIG. 3A and FIG. 3B. The results for a control cell using only a plain platinum electrode are shown in FIG. 3C. The coincidence of the peaks in 3A and 3B is conclusive proof of water splitting as claimed for the present cell.

Under the experimental conditions described above, the dihydrate polycrystal $(Chl\ a·2H_2O)_n$ is stable with respect to acid, heat, intense light and oxygen. Sample analysis after several hours of continuous gas evolution at pH 3 under white light irradiation revealed no detectable traces of Chl a degradation. In order to evaluate long-term stability, a platinized Chl a electrode was prepared and was periodically subjected to experimental observation. This electrode remained photoelectrolytically active, showing no signs of performance deterioration.

About 1 ml of the gaseous photolysis prodicts was collected over a 30 min period. No bubble formation was observed in unplatinized Pt-Chl a cells irradiated under similar conditions over a twenty-hour period.

Accordingly, it will be appreciated that the platinization of $(Chl\ a·2H_2O)_n$ polycrystals has enhanced the quantum efficiency of the Chl a-$H_2O$ cell described in U.S. Pat. No. 4,002,950 by at least two orders of magnitude. At 740 nm, the quantum efficiency of the unplatinized Chl a cell is about 0.2%. We thus estimate that the quantum efficiency of the present cell is at least 20% at 740nm. The rate of gas evolution and estimated monochromatic quantum efficiencies are comparable to corresponding observations on the photolysis of water using $SrTiO_3$, except that we have extended the functional range of wavelengths to the entire visible and near infrared regions of the solar spectrum, which is where the great bulk of solar irradiation reaching earth is concentrated.

It will be appreciated by those skilled in the art that the water splitting accomplished by the invention described may be accomplished by other variations, such as by growing a single chlorophyll crystal and coating or impregnating such a crystal with Pt-black. This invention is not limited by the specific construction herein illustrated, nor by the narrow parameters given for construction of a suitable electrode, nor by the specific electrolyte as described, but only by the scope of the appended claims.

We claim:

1. A photoelectric cell including a sandwich configuration,
said sandwich comprised of;
a first layer of platinum black deposited on a substrate,
a second layer of chlorophyll polycrystals deposited in contact with said first layer, and
a third layer of platinum black deposited in contact with said second layer,
whereby upon suspension of said sandwich configuration in an aqueous electrolyte and upon light irradiation of said sandwich configuration, water splitting occurs.

2. A photoelectric cell comprised of: a sandwich configuration which includes a layer of platinum particles plated upon a substrate and a layer of chlorophyll polycrystals $(Chl\ a-2H_2O)_2$ deposited in contacting relationship with said platinum particles, and another layer of platinum particles deposited in contacting relationship with said chlorophyll polycrystals,
a transparent case adapted to receive said sandwich configuration and an electrolyte;
an aqueous electrolyte in said case and in which said sandwich configuration is immersed whereby upon light irradiation, water splitting occurs in said aqueous solution.

3. The method of construction of a photoelectrically active sandwich configuration comprising:
a first step of platinizing a metallic base electrode by suspending said electrode in a chloroplatinic acid solution and passing a current through said solution,
a second step of depositing a layer of polycrystalline chlorophyll a on said platinized electroce, and
a third step of depositing a layer of platinum particles on said layer of polycrystalline chlorophyll a by repeating said first step.

* * * * *